United States Patent [19]
Hayes

[11] Patent Number: 5,681,757
[45] Date of Patent: Oct. 28, 1997

[54] PROCESS FOR DISPENSING SEMICONDUCTOR DIE-BOND ADHESIVE USING A PRINTHEAD HAVING A MICROJET ARRAY AND THE PRODUCT PRODUCED BY THE PROCESS

[75] Inventor: Donald J. Hayes, Plano, Tex.

[73] Assignee: MicroFab Technologies, Inc., Plano, Tex.

[21] Appl. No.: 639,435

[22] Filed: Apr. 29, 1996

[51] Int. Cl.⁶ .......................... H01L 21/56; H01L 21/58; H01L 21/603; H01L 21/68
[52] U.S. Cl. .............. 437/7; 437/212; 437/216; 437/243; 437/249; 437/924; 437/220; 29/25.01; 156/295
[58] Field of Search ............................ 437/7, 212, 216, 437/243, 249, 924, 220; 29/25.01; 156/295; 228/123.1; 222/1

[56] References Cited

U.S. PATENT DOCUMENTS

| | | |
|---|---|---|
| 3,683,212 | 8/1972 | Zoltan . |
| 5,053,100 | 10/1991 | Hayes et al. . |
| 5,092,864 | 3/1992 | Hayes et al. . |
| 5,187,123 | 2/1993 | Yoshida et al. ............. 437/220 |
| 5,227,813 | 7/1993 | Pies et al. . |
| 5,235,352 | 8/1993 | Pies et al. . |
| 5,400,064 | 3/1995 | Pies et al. . |
| 5,415,679 | 5/1995 | Wallace . |
| 5,423,889 | 6/1995 | Colquitt et al. ............. 437/220 |
| 5,426,455 | 6/1995 | Williamson et al. . |
| 5,435,060 | 7/1995 | Hayes et al. . |
| 5,436,648 | 7/1995 | Stortz et al. . |
| 5,444,467 | 8/1995 | Stortz . |

*Primary Examiner*—David E. Graybill
*Attorney, Agent, or Firm*—Harris, Tucker & Hardin, P.C.

[57] ABSTRACT

The present invention relates to the process of die bonding semiconductor integrated circuit microchips with adhesive deposited from microjets in a precise pattern. Print-head technology equivalent to that used in inkjet printers is used to apply the adhesive substance (most commonly an epoxy). The use of microjets in an "array printhead" to deposit an adhesive pattern provides advantages in the ability to control the location and size of the adhesive droplets with a high degree of precision. The method also provides for individual actuation of the microjets providing the ability to rapidly change from pattern to pattern without the need to change and clean heads and equipment or to provide multiple heads. The method has application in standard die bonding as well as "flip-chip" processes using "bumped dies." The high degree of precision available allows adhesive to be printed in between the solder bumps of a "bumped die" providing stronger bonding and an underfill without interfering with the electrical connection created by the solder bumps. Also disclosed is a novel method for accomplishing a "flip-chip" process in which the array printhead is used to print conductive epoxy directly on the interconnect pads of the die, replacing the solder bumps of a standard "bumped die." The die is then aligned and placed onto a substrate, with the conductive epoxy serving as both the conductive path and a strong adhesive bonding agent.

28 Claims, 6 Drawing Sheets

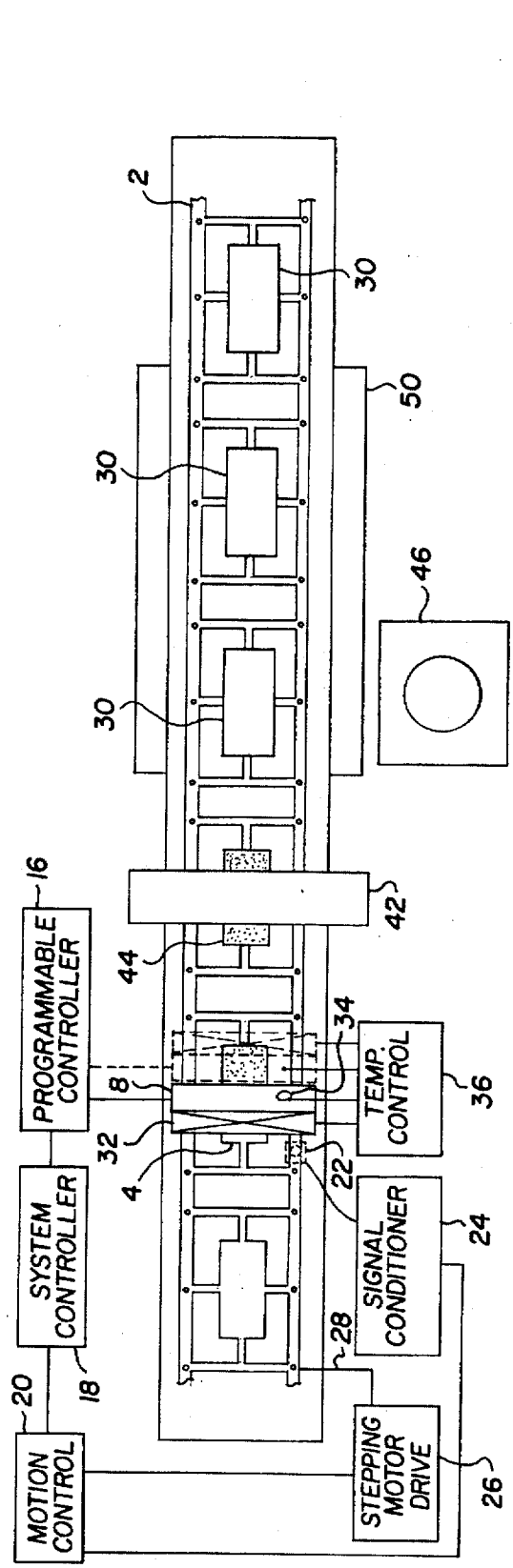
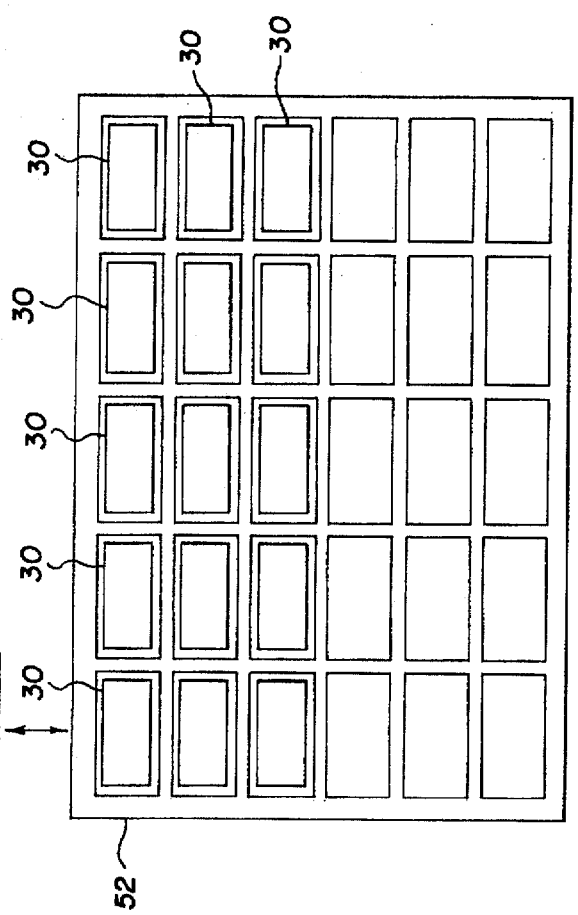
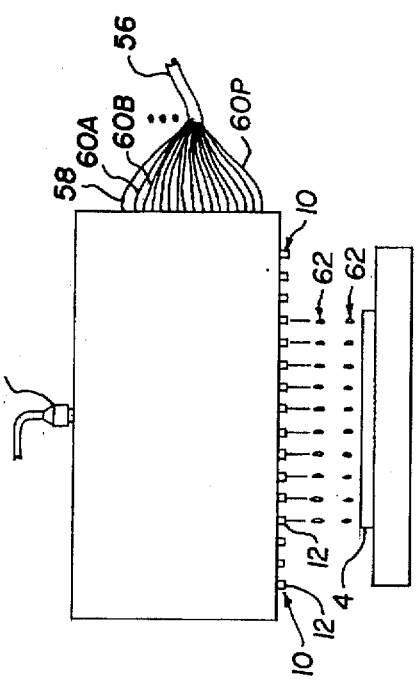
Fig. 2
Fig. 3

PROCESS FOR DISPENSING SEMICONDUCTOR DIE-BOND ADHESIVE USING A PRINTHEAD HAVING A MICROJET ARRAY AND THE PRODUCT PRODUCED BY THE PROCESS

FIELD OF THE INVENTION

The present invention relates to the process of die bonding semiconductor integrated circuit microchips with adhesive deposited from microjets in a precise pattern. The process includes combining microchips with substrates electrically and mechanically using microjetted conductive and non-conductive curable adhesive.

BACKGROUND OF THE INVENTION

In the production of microelectronic devices such as integrated circuits, it is necessary to support and combine completed microchips (or "dies") with a substrate which has solder bumps, pads, or leads suitable for making electrical connections with other components. In a conventional die bonding operation, lead frames are provided in elongated strips which have repetitive and successive die bonding surfaces which are generally the same shape and slightly larger than the chip to be bonded. The lead frames are something like a metallic strip of motion picture film having opposite side edges with openings along the edge for controlling the position of the lead frames during processing. The center of the lead frame has successive repetitive bonding surfaces surrounded by leads which subsequent to bonding will be connected to proper places on the microelectronic device after it is bonded to the frame.

Lead frame strips go into a conventional machine called a die bonder having a dispense head that dispenses an epoxy or other adhesive in a drop or a pattern of drops onto successive bonding surfaces of the lead frame. The strips are normally moved successively under the dispense head where the adhesive is applied and then advanced to successive stations where the corresponding chips are placed over the bonding surface, pressed into the adhesive and subsequently cured to secure the chip to the frame. A similar process is also done on elongated printed circuit boards or on ceramic substrates with conductors.

The conventional process can print a pattern of drops of adhesive instead of a single blob of adhesive by employing a dispense head which has a group of hollow needles adjacently spaced where they are needed to produce a particular pattern. The typical pattern is usually a rectangle or square pattern because that is the shape of the chips to be bonded. The conventional needles operate like syringes by dispensing drops from the tip in response to movement of a piston or pressure applied to a reservoir in fluid communication with the inlet of a group of needles. By first applying and then releasing pressure, liquid adhesive is forced into the inlet and out the tips of the dispensing needles to deposit a quantity of epoxy adhesive onto the bonding surface.

After depositing adhesive on the bonding surface, the lead strip is indexed to a pick and place station where a chip is placed on the uncured adhesive and upon subsequent indexing passes through a station where the adhesive is rapidly cured so that when the lead frame comes out of the machine it has a chip on each bonding surface ready for processing. Conventional processing further includes a wire bonder where tiny wires from pads on the chip are connected to leads and the lead frame for electrical interconnects. Still further processing runs the lead frame into another machine called a mold machine which molds a plastic around and over successive chips to protect them. After the strip comes out of the mold machine, individual microchips are trimmed out of the lead frame with electrical leads extending from the plastic shell.

Some operational and practical problems are presented with the use of the adhesive dispensing head described above. While it can produce a pattern comprising one drop from each needle if properly adjusted, it can produce only a single pattern defined by the layout of the tips of the needles. This may be suitable for long production runs with the same size microchips, but is inflexible if the shape and size of the substrate and/or chips are changed. A change in the shape of the pattern requires that the present dispensing head be removed and cleaned and a different dispensing head installed. Downtime which results is compounded by the need to make adjustments to the piston stroke, pressure, temperature or other variables before a satisfactory deposit of an adhesive pattern is achieved.

There are also problems with consistency of deposition with conventional dispense heads. It is difficult to get very small drops repetitively of a consistent size. Flexibility is limited. It is difficult or impossible to produce more or bigger or smaller drops from some of the needles in order to put more or less adhesive in certain places. The individual needles are not individually controllable.

SUMMARY OF THE INVENTION

The process of die bonding semiconductor integrated circuits ("dies") to a substrate typically involves several steps. The substrate must be presented or indexed into position for the dispensing of adhesive; the adhesive should be applied in such a way that the substrate is ready to accept the die; optionally, the adhesive may be activated, for example by exposure to a source of ultraviolet radiation; the die is picked up or presented and placed onto the adhesive on top of the substrate in a precise location; and the adhesive is set or cured, bonding the die to the substrate. This patent application covers an improved method of achieving the application of the adhesive and preparing the substrate to receive the die.

In practicing the invention of the present application, instead of using dispense heads which perform like an array of syringes to present the adhesive to the substrate, printhead technology equivalent to that used in inkjet printers is used to apply the adhesive substance (most commonly an epoxy). The use of what may be called an "printhead array" presents numerous advantages over preexisting methods and produces not only traditional products but also may be used to produce novel products through the superior characteristics of this method.

A printhead array comprises a series of micro-thin tubular channels with dispensing tips at the lower ends (the channels plus the tips or nozzles collectively called "microjets" in this application). The channels are fed from a reservoir of fluid. In this case the fluid is an adhesive such as epoxy. Each tubular channel is surrounded by a circular piezoelectric actuator, PZT for example, and individually electrically connected to a programmable controller. When the proper voltage pulse is applied at the command of the programmable controller the piezoelectric actuator ejects a small drop of fluid of consistent size from the nozzle or dispensing tip at the bottom of the microjet. The programmable controller may actuate any combination of the numerous microjets, placing drops of adhesive onto the substrate in a pattern. By relative motion of the substrate with respect to the printhead array, a more complex 2-dimensional pattern may be created by firing one combination of microjets while in one position, and additional/alternative combinations in other positions.

The use of piezoelectric actuated microjets rather than syringe-type dispensers provides for smaller drops of adhesive placed at closer intervals under greater control. For this reason, the drops of adhesive produced from the microjets are referred to as microdrops from this point forward in the application. Further, the size of the drops is consistently controllable and the precision of placement is improved. Because of the tighter deposition tolerances attainable with a printhead array, smaller drops of adhesive may be placed closer together rather than larger drops placed further apart. This creams the opportunity to create more optimal gluelines which have a more uniform thickness and distribution. Tighter deposition tolerances also allow the use of adhesives to cream an underfill on substrates used with "bumped dies" in "flip chip" procedures. The "bumped dies" have a pattern of solder bumps on top of bondable interconnect pads which are then brought into contact with matching bondable interconnect pads on a substrate in a "flip chip" process.

The printhead array allows adhesive to be printed onto the "bumped die" in a pattern between the pattern of solder bumps without contaminating the solder bumps themselves. This results in enhanced structural bonding as well as underfill which assists in sealing off the distinct electrical connections created by the solder and reducing problems with outside contaminants. Alternatively, the tighter deposition tolerances allow for conductive adhesive to be deposited directly onto interconnect pads of a die which may then be bonded to matching interconnect pads on a substrate. The electrically conductive adhesive provides an electrical connection between the die and substrate and strong structural bonding. This option eliminates the step of depositing droplets of solder on dies to create the bumped dies, while still providing many of the same benefits in the end product.

The ability to individually actuate channels allows the use of a single printhead array to produce any variety of pattern shape and size without the need to change heads. This eliminates additional steps of replacing, aligning, and cleaning heads which must otherwise occur. The printhead eliminates the need for additional dispensing heads if different patterns are called for in the same production line. For example, if working to bond a multi-chip module with differently sized dies, the same printhead may be used to print a distinct size and pattern of adhesive on the substrate in the location where each die is to be applied. Further, even on simple lead frames, if smaller production runs are desired with a run using one size and pattern of adhesive followed by a run of a different size and pattern, the down time may be significantly reduced by the current invention. Instead of needing to remove, clean and replace the dispensing heads to obtain the proper head for the changed pattern, one must only reprogram the printhead array (which acts as a universal printhead) to the newly desired size and pattern and continue without delay. In short, the method of the invention provides an ease and rapidity of adjustment in the die bonding of new or different sizes of die and substrate using program instructions and a universal printhead.

Finally, the present invention also provides the ability to better optimize the glueline and final bond between the die and the substrate. Not only are smaller drops and finer patterns possible to make up the adhesive, but a large number of different patterns may be tested by printing the pattern, assembling the die to the substrate, and then examining the resulting bond. With the prior art technology, this would have involved making physical changes to numerous syringe type dispensers and a series of stoppages to change the physical configuration or the dispenser. With the technology of the current invention, the programmable controller may be set to print a set number in one pattern and then progress to another pattern and print another set number, and so forth. Thus, in one extended uninterrupted print run a wide variety of potential patterns of adhesive may be tested and assembled, and the resulting units examined to empirically determine which is providing the optimal characteristics.

BRIEF DESCRIPTION OF THE DRAWINGS

FIG. 2 is a schematic plan view of the die bonding machine of FIG. 1 showing a succession of bonding surfaces in a lead frame and supplied with a pattern of adhesive microdrops from the array of microjets with microelectronic devices being positioned on successive bonding surfaces;

FIG. 3 illustrates schematically the printhead of the preferred embodiment in front elevation applying microdrops of adhesive to a substrate from a group of adjacent individually electrically operated microjets;

DETAILED DESCRIPTION

Figure 1:
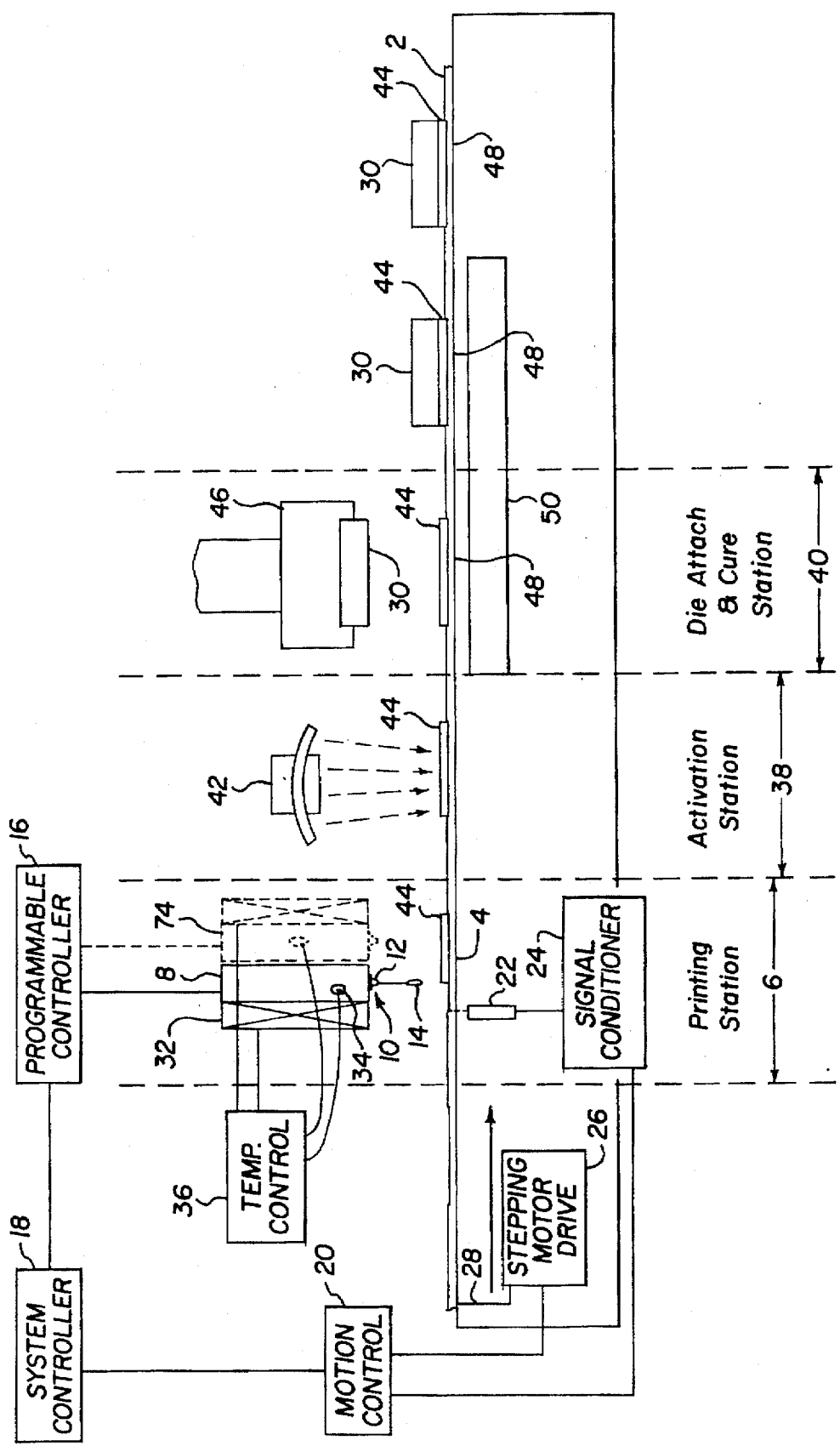
FIG. 1 is a schematic side view of a preferred embodiment of the invention optionally employing one or two printheads having an array of individually electrically operated microjets. An optional ultraviolet activation station is also shown, in a conventional die bonding machine.

FIG. 1 illustrates the key parts of a "die bonder." The function served by the die bonder is as follows:

(1) To present or index a substrate into position for the dispensing of the adhesive in the location where the die is to be attached;

(2) to deposit the adhesive on to the substrate (note: the highest production volumes today are lead frames; but other substrates maybe used such as multi-chip module ("MCM") substrates, ceramic substrates, printed circuit board ("PCB") substrates for BGA packages, etc.); the adhesive should be applied in such a way that it is ready to accept the die;

(3) to pick up a die from a carrier (or a sod wafer on tape or some other method of presenting the die to the machine) and place the die onto the adhesive in a precise location (heat may be applied to this operation);

(4) to cure or set the adhesive.

FIG. 1 illustrates a specific embodiment in which a lead frame strip 2 is used to present the substrates for die bonding. In FIG. 1, substrate 4 (in the preferred embodiment a lead frame) is positioned in a die bonder. The first phase in the process is to uniformly dispense adhesive in the printing station 6. The printing is carried out using printhead array 8. Printhead array 8 has a line of microjets 10, each with a dispensing tip 12 or nozzle dispensing microdrops 14 of adhesive. FIG. 1 shows a side view of printhead 8. Printhead array 8 is positioned a dispensing distance above the plane in which the substrates are placed. The dispensing distance is optimally determined by one skilled in the art based on factors such as the specific adhesive used, the amount used, and the material and surface characteristics of the substrate. The dispensing distance will ideally allow sufficient room for microdrops 14 to fully separate from microjets 10, while not so much distance that significant amounts of splatter occur. Each microjet 10 in printhead 8 may be fired under digital control. The signal to fire individual microjets comes from programmable controller 16.

Programmable controller 16 controls which of the individual microjets 10 is fired. Programmable controller 16 receives a signal from system controller 18 telling it that either substrate 4 is in position or will be in position at a specific time. Programmable controller 16 then sends predetermined electrical drive pulses to printhead array 8 telling it to fire at the appropriate time. This predetermined drive pulse sequence fires microjets 10 that were programmed to be fired, and thus prints the required adhesive pattern. This process can be repeated until the desired pattern is completely printed. Printing is accompanied by relative movement between printhead 8 and target substrate 4. Either one may be moved.

System controller 18 contains information on the die bonding requirements, the specific substrate, and the adhesive pattern being printed. System controller 18 communicates that information to both the motion control system and the printing system. In one mode of operation, system controller 18 receives a signal from motion controller 20 that the desired steps have been taken and then sends a signal to programmable controller 16 to fire the appropriate microjets 10. This process would be repeated until the complete adhesive pattern was printed.

The motion control system preferably includes position sensor 22. This device senses the specific position of substrate 4 along the track. The output of position sensor 22 goes to signal conditioner 24. Signal conditioner 24 receives the raw signal from position sensor 22 and modifies it so that it can be read by motion controller 20.

Motion controller 20 receives signals from signal conditioner 24 as to the location of substrate 4. Motion controller 20 then sends signals to stepping motor 26 to move substrate 4 a programmed amount. Stepping motor 26 is an electromechanical device that receives a digital input signal from motion controller 20 and transforms that signal into a small precise step along the linear direction. This linear motion is connected to substrate 4 through a mechanical linkage 28 (symbolically represented in FIGS. 1 and 2). The information about the specific sequence of movements to be followed is downloaded to motion controller 20 from system controller 18.

One skilled in the art would recognize that the performance of the system discussed could be accomplished with different configurations. For example, signal conditioner 24 could be built in to position sensor 22; motion controller 20 could talk directly to programmable controller 16 and system controller 18 would only download the desired pattern. One skilled in the art would also recognize that the various functions could all be packaged into the same box. For example, the programmable controller and the motion controller could be boards mounted in a PC and the PC could act as the system controller.

In another configuration of the system, a mechanical linkage could be connected to printhead 8. Stepping motor 26 would then move printhead 8 and not substrate 4. In this configuration, position sensor 22 could be mechanically coupled to printhead 8. Position sensor 22 would still measure the relative motion of printhead 8 to substrate 4 and send this information to motion controller 20. Position sensor 22 can be any conventional device (employing, for example, vision technology or other technology for accurate 1 or 2-dimensional location) which will sense the position corresponding to a desired position of dies 30 being processed and deliver a signal indicative of that position to motion controller 20 with enough accuracy to achieve the desired adhesive pattern in the desired location on substrate 4 (or in the event of a "flip chip" process potentially on a bumped die or on the matching substrate).

FIG. 1 also shows heater 32 attached to printhead 8. The selection of the adhesive would determine the proper temperature selection for heater 32. Some adhesives may not require a heater. A thermocouple 34 or equivalent would be used to monitor the temperature of the adhesive fluid at some point within the printhead assembly. A signal from thermocouple 34 would be sent to temperature controller 36 which would regulate the power to heater 32. Heat is desirable to reduce the viscosity of heavy bodied epoxy adhesive components such that they may more efficiently and controllably may be dispensed as microdrops 14 by microjets 10.

In the illustrated embodiment, substrate 4 is moved linearly relative to printhead array 8 as the desired microjets are fired. This may be achieved by either indexing substrate 4 (a lead frame in the preferred embodiment) and in a controlled way, moving printhead 8 relative to the fixed substrate 4, or moving substrate 4 in a controlled way under printhead array 8 as printhead array 8 is fired in a programmed way. One skilled in the art may recognize that other substrates besides lead frames may successfully be employed using a proper linkage and motion system. One skilled in the art would also recognize that alternatives exist to a strictly linear path in relative motion. For example, the substrate could be indexed onto a wheel which is then rotated with the printing head radially aligned with the wheel over the substrate. The substrate could then be moved by rotating the wheel allowing the printing pattern to be laid on the substrate. Furthermore, the printhead array could be moved relative to a substrate either radially inward and outward in order to cover a broader or multiple substrates along a wheel radius or in a tangential direction with respect to the circular wheel.

FIG. 1 also shows an activation station 38 constituting an additional phase between printing phase 6 and die attach & cure phase 40. Some adhesives are catalyzed by radiation. Some adhesives contain a catalyst which initiates cure at elevated temperatures. If the viscosity of the adhesive is high at room temperature, it will be necessary to heat the adhesive by means of heater 32 before dispensing through microjets 10. It is often desirable to initiate crosslinking after dispensing the adhesive. This may be accomplished in activation station 38 through the use of ultraviolet radiation source 42. This UV energy source generates light energy in the range of 250–450 nanometers. Once dispensed adhesive 44 has been exposed to this energy for a short time (generally less than 15 seconds), it is ready to receive a die 30 and be rapidly cured in die attach and cure station 40. In die attach and cure phase 40, pick and place head 46 picks up a die 30 from a carrier and places it accurately onto substrate 48 with dispensed adhesive 44. In order to facilitate curing, heater 50 may be used during this phase. After die attach and cure phase 40, FIG. 1 also shows a couple of attached combinations of die 30, dispensed adhesive 44, and substrate 48, as they are continuing or completing the curing process before being removed from the active line.

FIG. 2 shows a top view of the key elements used in the die bonding process. In addition to what was illustrated in FIG. 1, we more clearly see die attach and cure phase 40 of the operation. Carrier 52 contains multiple dies 30. Dies 30 are placed into carrier 52 off line and then positioned into the die bonding assembly. The drawing shows dies in position on the top half of carrier 52 and empty cavities on the lower half. The dies from the lower half have already been removed. Pick and place head 46 moves over to a die 30 in the carrier 52, picks up die 30, then moves to a location over the substrate 48. Finally, pick and place head 46 moves down and places die 30 into dispensed adhesive 44 laid down on substrate 48. After this, the lead frame of the preferred embodiment will be indexed to the next position while pick and place head 52 moves to pick up the next die 30.

One skilled in the art will recognize that in the event printing phase 6 of the operation is carried out by moving printhead 8 while substrate 4 or lead frame is maintained in an indexed position, then die attach phase 40 will best occur on one substrate 48 at the same time that printing phase 6 is being accomplished on substrate 4 further up the assembly line. Under these conditions each phase would be working on a steady substrate or lead frame and so could be performed simultaneously, saving time. In the event that substrate 4 is moved during printing phase 6, then die attach phase 40 on frame or substrate 48 further down the line will most likely not be accomplished simultaneously. Under most embodiments, the substrates along the assembly line are coupled together in their motion down the line (in the example of lead frames they are physically all on the same strip 2). If substrate 4 in printing phase 6 is being stepped through a series of short movements in order to lay down the 2-dimensional drop pattern from a non-moving printhead array 8, then this same motion will be imparted to substrate 48 upon which pick and place head 46 must place die 30. Since die attach phase 40 is best carried out on a substrate 48 which is not moving, optimally die attach and cure station 40 will not be trying to operate on the moving target created by an active printing station 6 in which substrate 4 is the key moving element. Both instances simply involve recognizing the fact that this is a continuous operation involving lead frames or substrates which are moving together down an assembly line.

FIG. 3 illustrates a side view of printhead array 8. Fluid connection 54 feeds adhesive to printhead 8. FIG. 3 also illustrates electrical connections 56 that connect programmable controller 16 to printhead array 8. In this set of electrical connections, a single lead 58 is ground which connects to every channel while multiple leads 60A, 60B, 60C, ... 60P connect one to each channel. When signals are sent to specific channels, a pattern of microdrops is created. An array of microdrops 62 is shown in FIG. 3. In this instance, microdrops 62 are shown coming out of the ten center microjets 10.

Figure 4:
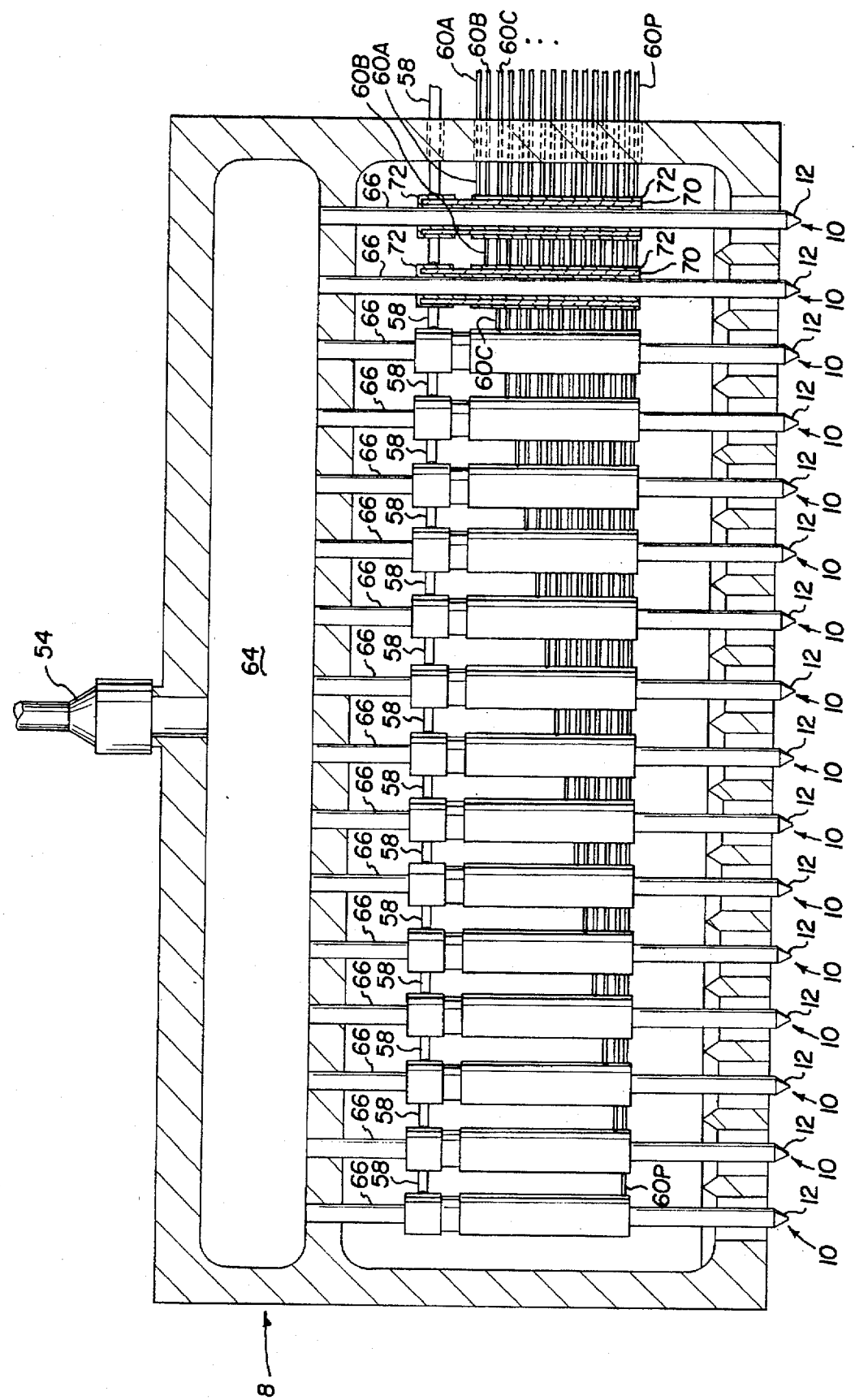
FIG. 4 is a front elevational cross section schematically illustrating the printhead of FIG. 3.

FIG. 4 illustrates one particular version of microjets 10 in printhead 8. Fluid inlet 54 allows adhesive to fill fluid reservoir 64. The choice of adhesive does not effect the overall operation of the system, but may effect appropriate internal settings such as the temperature of operation of the microjets, the dispensing distance, etc. The end product may also be impacted by adhesive choice. For example, in most instances it is desirable that the finished microchip be able to pass heat into the substrate, so an adhesive, usually epoxy, with good thermal conductivity is desirable. Alternatively, in some instances it might be desirable to ground the microchip to the substrate, which would call for the use of an electrically conductive adhesive. Further potential uses based on adhesive choice will be discussed later.

Fluid reservoir 64 feeds the selected adhesive to the input of sixteen channels 66. Each of channels 66 stretches down through printhead 8 and ends in a nozzle or dispensing tip 12. Dispensing tips 12 are actually open, but because of the thin size of channels 66 the surface tension of the adhesive will prevent it from leaving channels 66 without outside intervention. The combination of a tubular channel 66 with a dispensing tip 12 is referred to as a microjet 10 through the course of this application. In the center of printhead 8, tubular channels 66 are surrounded by circular piezoelectric actuators 70. A particular piezoelectric element used for this application is PZT. This type of device preferably comprises a piezoelectric transducer 70 in a tubular configuration which surrounds a portion of a channel 66 and is in contact with channel 66. The piezoelectric transducer 70 is driven by voltage pulses provided by drive electronics in programmable controller 16 with a signal having a magnitude, pulse shape, and frequency adapted to produce microdrops of adhesive 62 of a desired size and frequency from dispensing tip 12. Electrical connections are made to conductors 72 on the PZT tubes. One connection 58 is the ground connection to all of piezoelectric elements 70. The other electrical connections 60A, 60B, 60C ... 60P are made individually to each of the PZT elements 70. As an example, if the proper voltage signal is applied to connection 58 and connection 60A, then the piezoelectric actuator 70 on the far right would fire. When a piezoelectric element fires in this situation, it may contract squeezing the tube and forcing out a measurable quantity of the fluid, in this case adhesive. By comparison, if the proper voltage signal was applied to connection 58 and connection 60C, then the third microjet 10 from the right would fire. As noted, nozzles or dispensing tips 12 form the ends of tubular channels 66. Adhesive microdrops 62 are ejected out of dispensing tips 12. This is only one type of printhead array that could be used for this application. Other possible embodiments include those disclosed in U.S. Pat. No. 5,227,813; U.S. Pat. No. 5,235,352; U.S. Pat. No. 5,400,064; and U.S. Pat. No. 5,435,060 which are incorporated herein by reference. Possible drive systems for this type of printhead array are illustrated in U.S. Pat. No. 5,425,455; U.S. Pat. No. 5,436,648; and U.S. Pat. No. 5,444,467 which are incorporated herein by reference. The construction and operation of ink jet technology devices of this type are described in detail in U.S. Pat. No. 5,053,100; U.S. Pat. No. 5,092,864; and U.S. Pat. No. 3,683,212, which are incorporated herein by reference.

Figure 5B:
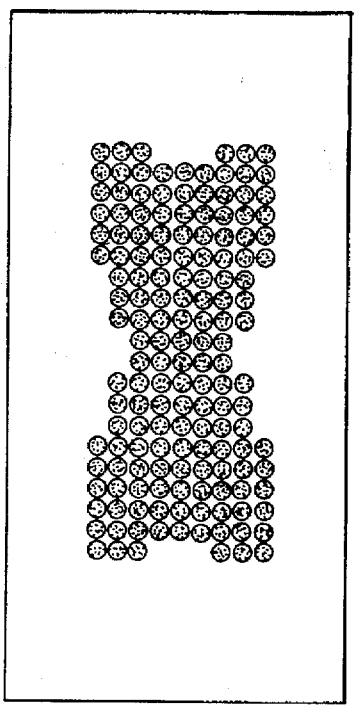
FIG. 5B illustrates a non-geometrically uniform pattern of microdrops of curable adhesive on a substrate produced by controllably firing the microjets in the printhead array while a pattern is being deposited on a substrate.
Figure 5A:
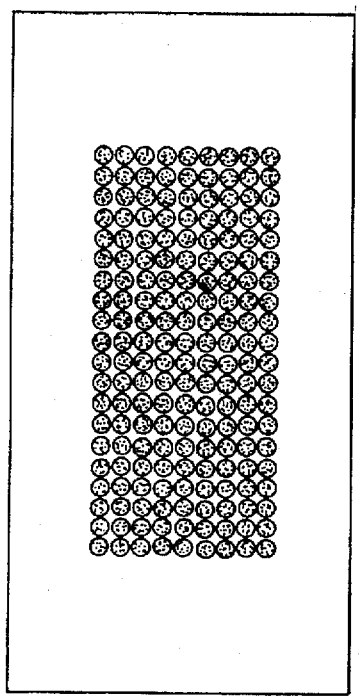
FIG. 5A illustrates a uniform pattern of curable die bonding adhesive produced on a substrate by the printhead of FIGS. 3 and 4.

FIG. 5A illustrates a basic adhesive pattern which could be provided by this process. This pattern consists of a nine drop wide pattern in which each of nine contiguous microjets fires sequentially throughout the pattern. The adhesive microdrops on this substrate were printed as discussed above. A more complex pattern is shown in FIG. 5B. In this pattern again the pattern is nine drops wide, but the programmable controller defines a more complex pattern where the nine contiguous microjets are not uniformly actuated throughout the printing process. The programmable controller defines which microjets are to be actuated at which point in the process. This defines the final pattern to be printed.

Figure 6B:
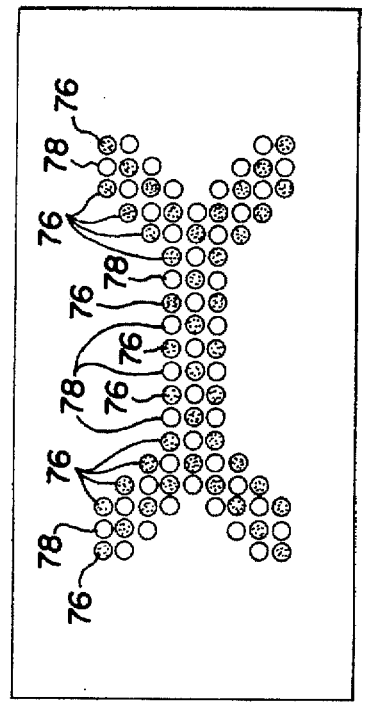
FIG. 6B illustrates how selective firing of dual printheads during deposition of microdrops of the two components of the curable epoxy during deposition on a bonding surface can produced non-geometrically uniform reproducible patterns.
Figure 6A:
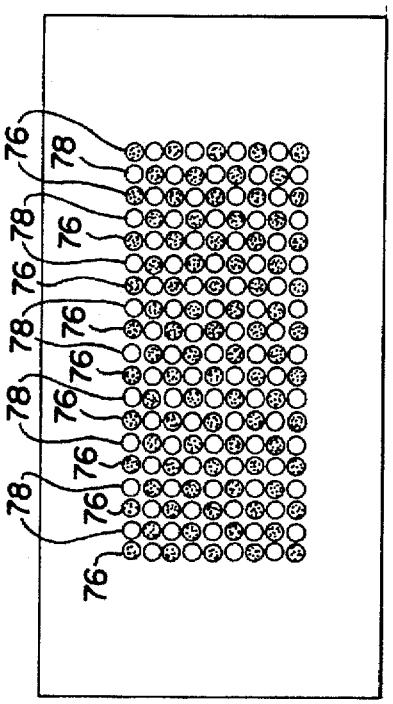
FIG. 6A illustrates a uniform pattern of microdrops using two of the printheads of FIGS. 3 and 4 wherein one of the printheads prints microdrops of one component of the curable epoxy and the other printhead prints an offset pattern of the other component of the curable epoxy on the bonding surface of a substrate.

In an alternative embodiment, two separate printhead arrays 8 and 74 may be provided within the system. FIG. 1 illustrates the possible second printhead array 74 with dotted lines. By providing two separate printhead arrays, two separate and fluid elements may be maintained. The two printheads 8 and 74 may be used to intersperse a pattern of microdrops utilizing the two separate fluid elements as shown in FIG. 6A where microdrops 76 constitute one component or adhesive while microdrops 78 constitute a second separate component or adhesive. A strong advantage is gained by using a two component adhesive system in which the components separately are inert but when combined begin a rapid curing process. Printing phase 6 may lay down the two components separately and distinctly onto substrate 4 without beginning a rapid cure. When the die is then placed on top of the adhesives during the die attach phase 40, the separate microdrops will be mixed together starting a rapid curing process only after the die is in place. This may also eliminate the need for a heating component to create a good cure. It certainly reduces the need for an activation phase 38. In this alternative embodiment as well, the printheads 8 and 74 may still be used to define a more complex pattern such as shown in FIG. 6B. This provides the opportunity to attempt to obtain a more optimal fluid distribution and final bond between the die and substrate.

Figure 7A:
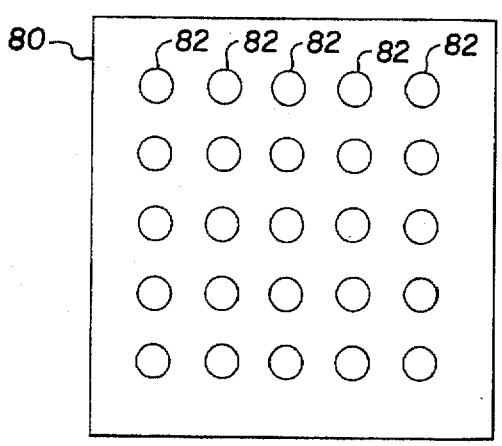
FIG. 7A shows a plan view of a pattern of solder bumps on a microelectronic device, typically used in an interconnect process known as "flip-chip," where the device is called a "bumped die" or "bumped I.C."
Figure 7B:
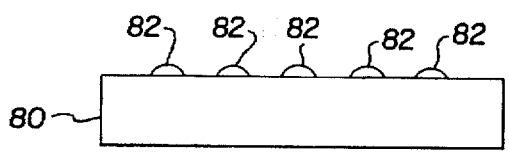
FIG. 7B illustrates the device of FIG. 7A showing the solder bumps when viewed from the end.

FIG. 7A shows a top view of die 80 (semiconductor integrated circuit or microchip) which has solder bumps 82 placed on interconnect pads or bonding pads which are not shown in this figure. This type of die is used in a process called "flip chip" bonding, in which die 80 is placed upside down onto substrate 84. In this process solder bumps 82 on die 80 are aligned with bondable interconnect pads 86 on substrate 84 and then the temperature is raised until the solder reflows and forms bonds which act as electrical connections as well as physical connections between die 80 and substrate 84. FIG. 7B provides a side view of bumped die 80.

Figure 8A:
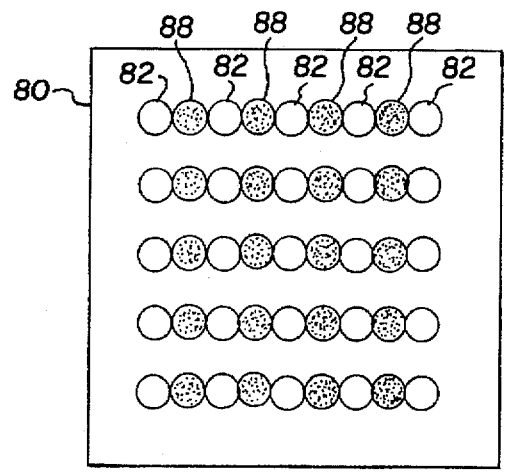
FIG. 8A shows the "bumped die" like FIG. 7A wherein a pattern of curable epoxy microdrops produced by the printhead of FIGS. 3 and 4 is deposited between the solder bumps of a "bumped die"
Figure 8B:
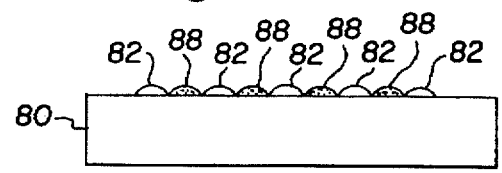
FIG. 8B is a view of FIG. 8A looking from the end.

FIG. 8A shows "bumped die" 80 in which an array of adhesive microdrops 88 are printed between solder bumps 58. FIG. 8B provides a side view of "bumped die" 80. In this case solder bumps 82 were already on die 80 prior to the adhesive dispensing operation. For this application, bumped die 80 would be processed through printing station 6 and possibly at activation station 38. The processes necessary to flip over die 80 and place it accurately onto interconnect substrate 84 would not be performed on the standard die bonder. A conventional "flip chip" bonder would be used for these operations. After bumped die 80 and substrate 84 are placed together and bonded, the cured adhesive resulting from microdrops 88 would serve the function of strengthening the bond between substrate 84 and die 80. Not only would it improve the viability of the attachment in a physical sense, but the adhesive would also serve as an underfill helping to seal off the separate connections made by the separate solder bumps 82 from the environment so that contaminants do not get between die 80 and substrate 84.

Figure 10:
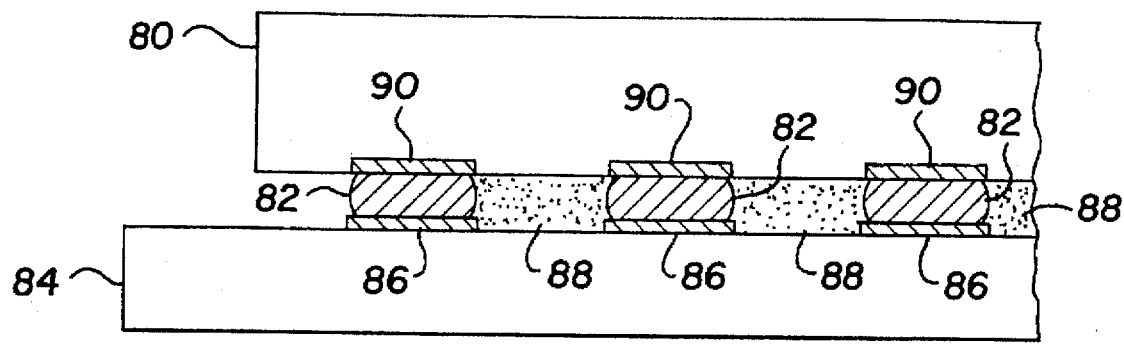
FIG. 10 represents a combination of the "bumped die" of FIG. 8A imbedded and placed over a substrate, such as a printed circuit board having solder pads which correspond with the solder bumps of the "bumped die"

FIG. 10 presents a side view of the finished products of a flip chip process using this type of adhesive underfill. Die 80 is on top of substrate 84. The two are electrically linked by solder 82 connecting bondable interconnect pads 90 on die 80 to bondable interconnect pads 86 on substrate 84. Adhesive 88 is present forming the additional physical connection as well as sealing off the soldered links. In a simple alternative embodiment, the adhesive microdrops could be printed on substrate 84 interspersed among its interconnect pads 86 instead of being printed on bumped die 80. The end product produced when bumped die 80 and substrate 84 with adhesive drops were combined would similarly have an underfill created by the adhesive microdrops which are interspersed among the solder-based electrical connections. Because of the precise placement and small drop size required to be able to print adhesive microdrops 88 in between solder bumps 82 (or interconnect pads 86) without interfering with the links to be created by the solder, this product was not practically manufacturable under the prior art.

Figure 9A:
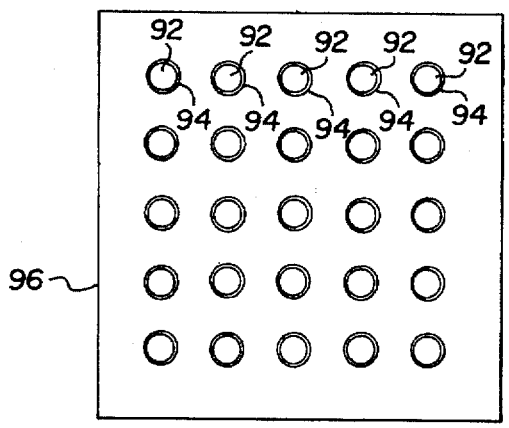
FIG. 9A is a plan view of a "bumped die" having bumps of conductive adhesive deposited in a pattern on each of the interconnect pads by using one of the printheads of FIGS. 3 and 4.
Figure 9B:
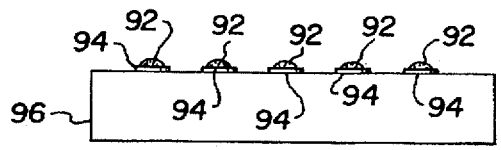
FIG. 9B is a view of FIG. 9A looking from the end.
Figure 11:
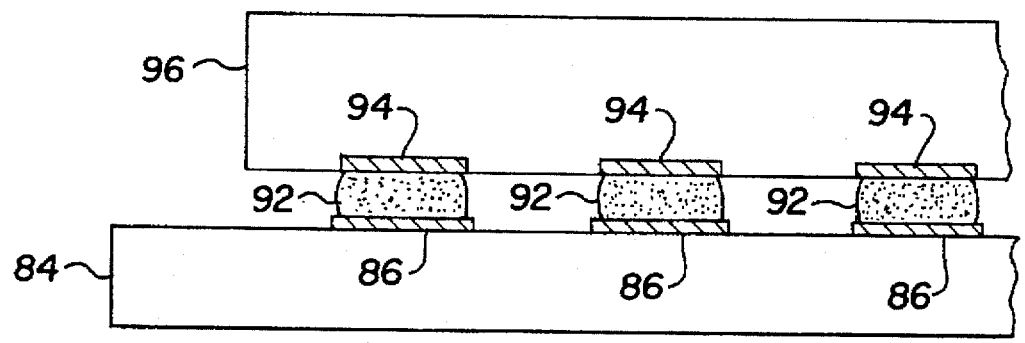
FIG. 11 is an end view of the "bumped die" of FIG. 9A turned over and placed upon a substrate, such as a printed circuit printed board, having a pattern of interconnect pads corresponding with the interconnect pads of the "bumped die" with conductive epoxy of the pattern interposed in electrical contact therebetween.

In another alternative embodiment, the adhesive printing system could be used to lay down electrically conductive adhesive microdrops 92 directly onto bondable interconnect pads 94 on die 96 as shown in FIG. 9A and in side view in FIG. 9B. This is like the bumped die 80 of FIG. 7 except that solder bumps 82 are replaced by electrically conductive adhesive bumps 92. In this manner, the flip chip process may then be done and adhesive 92 would serve a dual function. Adhesive 92 would act as both the electrical conductor in place of the solder and also as a superior physical bonding mechanism. This would provide the advantage of not needing another process to place solder bumps on the bumped die, cutting down the expense of manufacturing. The product as shown in FIG. 11 has die 96 connected to substrate 84 with a link created by conductive epoxy 92 between bondable interconnect pads 94 and 86. A product of this type is not currently known, nor is it practical again because of the deficiency of conventional dropper tubes producing and placing small microdrops precisely on the appropriate interconnect pads.

In addition to the matters illustrated in the figures, those skilled in the art will recognize the additional opportunities created by the advantages of smaller drops, finer patterns, and flexibility of programming what pattern to print, all of which are provided by the current method. If, for example, there was a problem with a microchip which was heating up and the desire is to create as thin a bonding layer as possible to provide better thermal conductivity to the substrate, then there may be an optimum pattern which may provide a better, more uniform coating. The flexibility of the printhead array provides the ability to run experiments on the fly. One could provide an extended lead frame strip, print one pattern on the first lead frame, modify the pattern slightly on a later frame, modify again later, and so on. One could then analyze the resulting 100 pans with 10 different patterns (for example) created in one printing run with only one printhead array and no physical changes or replacements necessary. The analysis will disclose which of the patterns provided the best end results among the choices tried. Because of the flexibility of the current system, a significant number of choices may be run in a very short time at very low cost, creating a new method for optimization which was previously cost prohibitive.

The flexibility of the printhead array also provides the ability to more efficiently process items such as multi-chip modules, where four or five different chips or dies of different sizes and/or shapes need to be bonded to one substrate. The method which is the subject of this application would allow a single head to print the adhesive pattern for each of chips or dies on the substrate in one process without interruption. Under the syringe needle/dropper techniques of the prior an either four or five different needle heads (dispensing heads) would have to be interchanged, with the concomitant stoppages, cleaning, and fitting delays, or one would have to have four or five separate heads mounted on the same substrate. Neither option would as efficiently produce the desired end product.

Alternatively, by using two printhead arrays with separate fluid reservoirs, one could also intersperse two types of adhesive. In addition to being able to print microdrops of different components of one adhesive (as previously discussed) one could also use the separate heads to intersperse two separate adhesives with distinct properties to best advantage. In the problem of an overheating chip, one may try to use a better bonding adhesive towards the outer portion of the pattern while concentrating on microdrops of an adhesive which is a better thermal conductor (while perhaps being less effective as a bonding agent) throughout the interior. This could also provide the ability to use stronger sealing agents in a barrier of microdrops around the outside while using an adhesive with more desirable properties on the interior in instances where contamination control is a key factor.

Finally, the size of the microdrops may also be controlled. By varying the voltage of the electrical pulse used to actuate the microjets, predictably varied amounts of adhesive are ejected. By varying the thickness of individual drops in a pattern, even greater control over end properties of the bond between die and substrate is obtained. For example, in some situations the act of placing the die into the dispensed adhesive on the substrate may tend to result in the pushing of the microdrops away from the central portion of the pattern causing the resulting bond to be thicker around the edges of the glueline than in the middle. By controlling the thickness of the microdrops the center microdrops may be made larger than the corresponding microdrops closer to the edge of the pattern. This may result in a more even distribution of adhesive after the dispensed adhesive has been compressed between the die and the substrate. The prior art dropper tubes and syringe dispensers were not able to create products using this type of precision control of individual droplet size.

Although the invention has been described with particular reference to presently preferred embodiments thereof, various modifications, alterations, variations, etc., may be made without departing from the spirit and scope of the invention as defined by the appended claims.

I claim:

1. Method of die bonding microchips to a substrate utilizing an array of individually controllable microjets arranged to deposit a desired pattern of microdrops of adhesive; comprising the steps of:

providing a printhead having an array of adjacent individually electrically operated microjets, each microjet having a dispensing tip for adhesive and a channel leading from the dispensing tip in fluid communication with a supply reservoir of die bonding adhesive;

providing a programmable controller adapted to selectively send electrical signals to any one or more of the microjets sufficient to fire selected ones of the microjets in a controlled sequence and thereby dispense microdrops from the dispensing tips of the fired microjets in the same controlled sequence;

mounting the dispensing tips of the printhead a dispensing distance from successive substrates on a surface of a medium capable of creating relative movement along a controlled path between successive substrates and said printhead;

sensing the substrate position relative to the printhead and sending substrate position information to the programmable controller, said position information including at least an initial depositing position, a series of intermediate depositing positions, and a final depositing position for each successive substrate;

creating relative movement along the controlled path between the successive substrates and the printhead;

firing the microjets in said controlled sequence in response to said position information as successive substrates reach the initial depositing position and ceasing said firing when each successive substrate reaches the final depositing position;

whereby a desired pattern of microdrops of adhesive is laid down on successive substrates moving along said controlled path.

2. The method of claim 1 further comprising the steps of pressing a bondable surface of a microchip against the desired pattern of microdrops deposited on one said substrate and curing the adhesive.

3. The method of claim 1 wherein the printhead array is arranged generally linearly along a line positioned across the controlled path and the successive substrates have an edge transverse to the controlled path having a length of said edge less than the length of the array whereby the step of firing the microjets in a controlled sequence is further defined as firing only those microjets corresponding to the length of said edge and not firing those microjets beyond said length.

4. The method of claim 1 wherein the programmed controller is programmed to allow selection of a group of adjacent microjets to fire in a controlled sequence without firing microjets outside said group of adjacent microjets and the step of firing the microjets in controlled sequence includes the step of sequentially firing only the microjets in said group to allow easy change to apply different desired patterns of adhesive to a substrate for chips having different shapes, without changing the printhead.

5. The method of claim 4 wherein the programmed controller is programmed to vary in a manner the number of microjets within the group that fire at successive stages during deposition of the desired pattern and the step of firing the microjets includes the step of firing in said manner the varying number of microjets to create a desired pattern which is geometrically non-uniform with respect to the surface of the substrate.

6. The method of claim 4 wherein the programmed controller is programmed to vary in a manner the strength of firing signal pulses to selected ones of the adjacent microjets during deposition of a desired pattern on a given substrate thereby increasing the amount deposited under the microjets where the firing signal pulses are stronger and the step of firing the microjets in controlled sequence includes the step of varying the strength of the firing signal pulses in the manner to allow deposition of a desired pattern of varying thickness across the surface of the substrate.

7. Method of die bonding microchips to a substrate utilizing an array of individually controllable microjets arranged to deposit a desired pattern of microdrops of adhesive; comprising the steps of:

providing a printhead having an array of adjacent individually electrically operated microjets, each microjet having a dispensing tip for adhesive and a channel leading from the dispensing tip in fluid communication with a supply reservoir of die bonding adhesive;

providing a programmable controller adapted to selectively send electrical signals to any one or more of the microjets sufficient to fire selected ones of the microjets in a controlled sequence and thereby dispense microdrops from the dispensing tips of the fired microjets in the same controlled sequence;

mounting the dispensing tips of the printhead a dispensing distance from a controlled path of a die bonding machine capable of controllably moving successive substrates along the controlled path and sending substrate position information to the programmable controller, said position information indicating at least an initial depositing position, a series of intermediate depositing positions and a final depositing position for each successive substrate;

moving successive substrates along the controlled path;

firing the microjets in said controlled sequence in response to said position information as successive substrates reach the initial depositing position and ceasing said firing when each successive substrate reaches the final depositing position;

whereby a desired pattern of microdrops of adhesive is laid down on successive substrates moving along said controlled path.

8. The method of claim 7 further comprising the steps of pressing a bondable surface of a microchip against the desired pattern of microdrops deposited on one said substrate and curing the adhesive.

9. The method of claim 7 wherein the printhead array is arranged generally linearly along a line positioned across the controlled path and the successive substrates have an edge transverse to the controlled path having a length of said edge less than the length of the array whereby the step of firing the microjets in a controlled sequence is further defined as firing only those microjets corresponding to the length of said edge and not firing those microjets beyond said length.

10. The method of claim 7 wherein the programmed controller is programmed to allow selection of a group of adjacent microjets to fire in a controlled sequence without firing microjets outside said group of adjacent microjets and the step of firing the microjets in controlled sequence includes the step of sequentially firing only the microjets in said group to allow easy change to apply different desired patterns of curable adhesive to a substrate for chips having different shapes, without changing the printhead.

11. The method of claim 10 wherein the programmed controller is programmed to vary in a manner the number of microjets within the group that fire at successive stages during deposition of the desired pattern and the step of firing the microjets includes the step of firing in said manner the varying number of microjets to create a desired pattern which is geometrically non-uniform with respect to the surface of the substrate.

12. The method of claim 10 wherein the programmed controller is programmed to vary in a manner the strength of firing signal pulses to selected ones of the adjacent microjets during deposition of a desired pattern on a given substrate thereby increasing the amount deposited under the microjets where the firing signal pulses are stronger and the step of firing the microjets in controlled sequence includes the step of varying the strength of the firing signal pulses in the manner to allow deposition of a desired pattern of varying thickness across the surface of the substrate.

13. Method of die bonding microchips to a substrate utilizing a dual array of individually controllable microjets arranged to deposit a desired pattern comprising a first desired pattern of microdrops of curable epoxy adhesive and a second adjacent desired pattern of curable epoxy adhesive similar to said first pattern, comprising the steps of:

providing a dual array of individually electrically operated microjets comprising a first array and a second array, each of said arrays having a supply reservoir for one component of a two part epoxy die bonding adhesive, each microjet in the respective arrays having a dispensing tip for adhesive and a channel leading from the dispensing tip in fluid communications with the supply reservoir;

providing a programmable controller adapted to selectively send electrical signals to any one or more of the microjets in said first array and said second array, said signals being firing signals sufficient in strength to fire selected ones of the microjets of each array in a controlled sequence and thereby dispense microdrops from the dispensing tips of the fired microjets in the same controlled sequence to produce a desired pattern comprising a first desired pattern from the first array and a second desired pattern from the second array;

mounting the dispensing tips of the first and second arrays adjacently, a dispensing distance from successive substrates on a surface of a medium capable of creating relative movement along a controlled path between successive substrates and said first and second arrays;

sensing the substrate position relative to the first and second arrays and sending substrate position information to the programmable controller, said position information including at least an initial depositing position, a series of intermediate depositing positions, and a final depositing position for each successive substrate;

creating relative movement along the controlled path between the successive substrates and the first and second arrays;

firing said microjets of the first array and the second array in said controlled sequence in response to said position information as successive substrates reach the initial depositing position and until said successive substrates reach the final dispensing position and ceasing firing said microjets until the next successive substrate reaches the initial depositing position;

whereby a desired pattern comprising a first desired pattern of microdrops of one component from the first array is deposited on successive substrates and a second desired pattern of microdrops of one component from the second array is deposited on successive substrates, wherein the first and second patterns are offset so that microdrops of each component are deposited adjacently;

mixing the two components of the epoxy after deposition by pressing a microchip against the components on at least one of the successive substrates whereby the microchip is epoxy bonded to the substrate.

14. The method of claim 13 wherein the programmed controller is programmed to allow selection of a group of microjets in the dual array to fire in a controlled sequence without firing microjets outside said group of microjets and the step of firing the microjets in controlled sequence includes the step of sequentially firing only the microjets in said group to allow easy change to apply different desired patterns of curable adhesive to a substrate for chips having different shapes, without changing the printhead.

15. The method of claim 14 wherein the programmed controller is programmed to vary in a manner the number of microjets within the group that fire at successive stages during deposition of the desired pattern and the step of firing the microjets includes the step of firing in said manner the varying number of microjets to create the desired pattern which is a geometrically non-uniform pattern with respect to the surface of the substrate.

16. The product produced according to the method of claim 13.

17. The product produced according to the method of claim 14.

18. The product produced according to the method of claim 15.

19. The method of die bonding flip chips having a pattern of solder bumps on a bonding surface to a substrate utilizing an array of individually controllable electrically operated microjets arranged to deposit a desired pattern of microdrops of curable adhesive between the solder bumps, comprising the steps of:

providing a printhead having an array of adjacent individually electrically operated microjets, each microjet having a dispensing tip for adhesive and a channel leading from the dispensing tip in fluid communication with a supply reservoir of curable die bonding adhesive;

providing a programmable controller adapted to selectively send electrical signals to any one or more of the microjets sufficient to fire selected ones of the microjets in a controlled sequence and thereby dispense microdrops from the dispensing tips of the fired microjets in the same controlled sequence;

mounting the dispensing tips of the printhead a dispensing distance from successive flip chips on a surface of a medium capable of creating relative movement along a controlled path between successive flip chips and said printhead;

sensing the flip chip position relative to the printhead and sending flip chip position information to the programmable controller, said position information including at least an initial depositing position, a series of intermediate depositing positions, and a final depositing position for each successive flip chip;

creating relative movement along the controlled path between the successive flip chips and the printhead;

depositing a first desired pattern of microdrops of curable die bonding adhesive between the solder bumps on successive flip chips by firing selected ones of said microjets in said controlled sequence in response to said position information as successive flip chips reach the initial depositing position and ceasing said firing when each successive flip chip reaches the final depositing position;

thereby preparing said flip chips for placement of the bonding surface against a substrate to make a bonded structure.

20. The method of claim 19 further comprising the steps of:

providing a substrate having a pattern of electrical pads like the pattern of solder bumps on said flip chips;

registering the solder bumps of the bonding surface of a said flip chip with the electrical pads of the substrate, in a combined structure;

heating the combined structure to create electrical interconnects between the flip chip and the substrate and simultaneously curing the curable die bonding adhesive to bond the combined structure together.

21. The method of claim 19 wherein the step of providing a printhead comprises the step of providing a first printhead having non-conductive curable die bonding adhesive in the reservoir, the step of mounting the dispensing tips of the printhead a dispensing distance from a controlled path comprises so mounting the first printhead and the step of depositing a first desired pattern of microdrops of curable die bonding adhesive comprises depositing said pattern of non-conductive curable die bonding adhesive between said solder bumps.

22. The method of claim 21 wherein the step of providing a printhead further includes the step of providing a second said printhead having conductive curable die bonding adhesive in said reservoir;

mounting the dispensing tips of the second printhead adjacent to the first printhead, a dispensing distance from a controlled path of a die bonding machine capable of controllably moving successive flip chips along the controlled path and sending flip chip position information to the programmable controller said position information indicating at least an initial depositing position, intermediate depositing positions and a final depositing position for each successive flip chip;

concurrently with depositing the first pattern of non-conductive adhesive between the solder bumps by selected microjets of the first printhead, depositing a second pattern of microdrops of conductive die bonding adhesive on successive flip chips by firing selected ones of said microjets of said second printhead in said controlled sequence, where said second pattern is registered with and the conductive die bonding adhesive is deposited on the solder bumps of the successive flip chips.

23. The method of claim 22 further comprising the steps of:

providing a substrate with a pattern of electrical pads like the pattern of solder bumps on said flip chips;

registering the conductive die bonding adhesive on the solder bumps of the bonding surface of a said flip chip with the electrical pads of the substrate in a combined structure;

heating the combined structure at a temperature below the flow temperature of the solder bumps to create electrical interconnects between flip chip solder bumps and substrate electrical pads by means of the conductive die bonding adhesive and simultaneously curing the non-conductive die bonding adhesive between solder bumps to bond the combined structure together.

24. The product produced according to the method of claim 19.

25. The product produced according to the method of claim 20.

26. The product produced according to the method of claim 21.

27. The product produced according to the method of claim 22.

28. The product produced according to the method of claim 23.

* * * * *